(12) United States Patent
Silverman et al.

(10) Patent No.: US 12,512,390 B2
(45) Date of Patent: Dec. 30, 2025

(54) SEMICONDUCTOR PACKAGE WITH LIQUID FLOW-OVER SEGMENTED INSET LID

(71) Applicant: Lockheed Martin Corporation, Bethesda, MD (US)

(72) Inventors: Alexander John Silverman, Wilmington, DE (US); Robert Richard Pearson, Philadelphia, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 712 days.

(21) Appl. No.: 17/811,505

(22) Filed: Jul. 8, 2022

(65) Prior Publication Data

US 2023/0015149 A1 Jan. 19, 2023

Related U.S. Application Data

(60) Provisional application No. 63/221,089, filed on Jul. 13, 2021.

(51) Int. Cl.

| | |
|---|---|
| *H01L 23/433* | (2006.01) |
| *H01L 21/48* | (2006.01) |
| *H01L 23/46* | (2006.01) |
| *H01L 23/467* | (2006.01) |
| *H01L 23/473* | (2006.01) |

(52) U.S. Cl.
CPC ...... *H01L 23/4336* (2013.01); *H01L 21/4882* (2013.01); *H01L 23/46* (2013.01); *H01L 23/467* (2013.01); *H01L 23/473* (2013.01); *H01L 2225/1094* (2013.01)

(58) Field of Classification Search
CPC ..... H01L 23/46; H01L 23/473; H01L 23/467; H01L 2225/06589; H01L 2225/1096
See application file for complete search history.

(56) References Cited

U.S. PATENT DOCUMENTS

| | | |
|---|---|---|
| 4,226,281 A | 10/1980 | Chu |
| 4,639,829 A | 1/1987 | Ostergren et al. |

(Continued)

FOREIGN PATENT DOCUMENTS

| | | | | |
|---|---|---|---|---|
| CN | 118800739 A | * | 10/2024 | ............... H05K 1/18 |
| WO | WO-2014148026 A1 | * | 9/2014 | ......... H01L 21/4882 |

*Primary Examiner* — David A Zarneke
(74) *Attorney, Agent, or Firm* — Baker Botts L.L.P.

(57) ABSTRACT

A semiconductor package is provided. The semiconductor package includes a segmented inset lid that is divided into a primary component and one or more secondary components, with each secondary component being coupled to the primary component by a compliant liquid-tight adhesive; wherein the primary component is a continuous region including i) a first surface, ii) a second surface, and iii) a boundary surface, the first surface including one or more integrated heat sink surfaces or one or more routing features to promote coolant distribution, the second surface contacting one or more semiconductor dies, and the boundary surface forming a sealing surface with a semiconductor substrate; wherein each secondary component contacts at least one other semiconductor die and forms a water-tight seal with the primary component; and a removable flow cover coupled with the segmented inset lid to form a seal along the boundary surface.

20 Claims, 5 Drawing Sheets

(56) References Cited

U.S. PATENT DOCUMENTS

| | | | | |
|---|---|---|---|---|
| 5,001,548 | A | * | 3/1991 | Iversen ................. H01L 23/473 |
| | | | | 257/E23.098 |
| 5,344,795 | A | | 9/1994 | Hashemi et al. |
| 5,548,482 | A | * | 8/1996 | Hatauchi ............. H01L 23/4093 |
| | | | | 257/713 |
| 6,275,381 | B1 | | 8/2001 | Edwards et al. |
| 6,373,133 | B1 | | 4/2002 | DiGiacomo et al. |
| 7,948,077 | B2 | | 5/2011 | Andry et al. |
| 8,367,469 | B2 | * | 2/2013 | Bonthron ................ H01L 21/50 |
| | | | | 257/E23.101 |
| 8,772,927 | B2 | * | 7/2014 | Bezama ............. H01L 23/3675 |
| | | | | 257/706 |
| 8,900,927 | B2 | | 12/2014 | Beaumier et al. |
| 9,646,910 | B2 | | 5/2017 | Ahuja et al. |
| 11,817,422 | B2 | * | 11/2023 | Igarashi .............. H01L 23/4334 |
| 12,402,286 | B2 | * | 8/2025 | Kwon ................ H05K 7/20927 |
| 2009/0127700 | A1 | | 5/2009 | Romig |
| 2012/0039046 | A1 | | 2/2012 | Beaumier et al. |
| 2012/0049341 | A1 | | 3/2012 | Bezama et al. |
| 2012/0196408 | A1 | | 8/2012 | Kadakia et al. |
| 2014/0239482 | A1 | * | 8/2014 | Kourakata ............. H01L 21/52 |
| | | | | 165/185 |
| 2023/0420335 | A1 | * | 12/2023 | Refai-Ahmed ....... H01L 23/433 |

\* cited by examiner

Figure 2

Lid 2 Flange Beneath Lid 1

Lid 2 Flange Above Lid 1

Lid 2 – Interfacing Substrate and Lid 1

Example flow for Parallel Flow Cover

Figure 4

SEMICONDUCTOR PACKAGE WITH LIQUID FLOW-OVER SEGMENTED INSET LID

PRIORITY CLAIM

The present application claims priority to U.S. Provisional Patent Application No. 63/221,089, filed Jul. 13, 2021, entitled "Semiconductor Package with Liquid Flow-Over Segmented Inset Lid," which is incorporated by reference herein in its entirety.

TECHNICAL FIELD

The present disclosure generally relates to semiconductor packaging, and more specifically to a semiconductor package having a liquid flow-over segmented inset lid.

BACKGROUND

A multi-chip module (MCM) is an electronic package consisting of multiple integrated circuits (ICs), semiconductor dies, and/or other discrete components that are assembled side-by-side into a single device. The various components of a MCM are mounted on a substrate and the bare dies of the substrate are connected to the surface via wire bonding, tape bonding, or flip-chip bonding. The module may be encapsulated by a plastic molding and mounted on a printed circuit board. MCM is the predecessor to System-in-Package (SiP), which integrates chips of varying functions and discrete components, and further allows 3D chip stacking of either packaged chips or bare chips to form a complete electronic system.

DESCRIPTION OF EXAMPLE EMBODIMENTS

Overview

According to an embodiment, a semiconductor package may include a segmented inset lid comprising a primary component, one or more secondary components, and a compliant liquid-tight adhesive between the primary component and the one or more secondary components. The primary component comprises a continuous boundary surface which forms a uniform sealing surface that may make continuous or intermittent contact with a semiconductor package substrate. The primary component may further comprise at least one continuous region having an upper surface and a lower surface. The upper surface of the at least one continuous region may include integrated extended surfaces to promote heat transfer and one or more routing features to promote coolant distribution. The lower surface of the at least one continuous region may contact one or more die that are mounted to an underlying substrate. The one or more secondary components may be fitted to the primary component and may contact one or more die that are mounted on an underlying substrate. The one or more secondary components may also include integrated extended surfaces to promote heat transfer and one or more routing features to promote coolant distribution. The semiconductor package may further include a removeable flow cover operable to be coupled to the segmented inset lid. The flow cover may be used to introduce coolant to the semiconductor package and may include at least one fluid inlet and at least one fluid outlet to facilitate fluid flow over the primary and secondary components when a pressure gradient is applied. The flow cover may form a seal with the continuous boundary surface of the primary component.

According to another embodiment, a semiconductor package may include a segmented inset lid that is divided into a primary component and one or more secondary components, with each secondary component being coupled to the primary component by a compliant liquid-tight adhesive, wherein the primary component is a continuous region including i) a first surface, ii) a second surface, and iii) a boundary surface, the first surface including one or more integrated heat sink surfaces or one or more routing features to promote coolant distribution, the second surface contacting one or more semiconductor dies, and the boundary surface forming a sealing surface with a semiconductor substrate wherein each secondary component contacts at least one other semiconductor die and forms a water-tight seal with the primary component, and a removable flow cover coupled with the segmented inset lid to form a seal along the boundary surface.

According to another embodiment, a method for assembling a semiconductor package may include the steps of applying a segmented inset lid to a substrate, the segmented inset lid comprising a primary component, one or more secondary components, and a compliant adhesive between the primary component and the one or more secondary components. The primary component comprises a continuous boundary surface which forms a uniform sealing surface that may make continuous or intermittent contact with a semiconductor package substrate. The primary component may further comprise at least one continuous region having an upper surface and a lower surface. The upper surface of the at least one continuous region may include integrated extended surfaces to promote heat transfer and one or more routing features to promote coolant distribution. The lower surface of the at least one continuous region may contact one or more die that are mounted to an underlying substrate. The one or more secondary components may be fitted to the primary component and may contact one or more die that are mounted on an underlying substrate. The one or more secondary components may also include integrated extended surface to promote heat transfer and one or more routing features to promote coolant distribution. The method may further include the step of coupling a removeable flow cover to the segmented inset lid. The flow cover may be used to introduce coolant to the semiconductor package and may include at least one fluid inlet and at least one fluid outlet to facilitate fluid flow over the primary and secondary components when a pressure gradient is applied. The flow cover may form a seal with the continuous boundary surface of the primary component.

According to another embodiment, a method for assembling a semiconductor package comprising: mounting a segmented inset lid to a semiconductor substrate, the segmented inset lid being divided into a primary component and one or more secondary components, with each secondary component being coupled to the primary component by a compliant liquid-tight adhesive; and coupling a removable flow cover with the segmented inset lid to form a seal along a boundary surface of the primary component.

Technical advantages of certain embodiments of this disclosure may include one or more of the following. Certain embodiments provide a thermally enhanced segmented lid solution for semiconductor packages having multiple die. Specifically, the segmented inset lid reduces assembly tolerances and assembly warpage, which result in excessive bond line thickness of thermal interface material in a semiconductor package. Furthermore, because the proposed components of the segmented inset lid are wetted, they reduce the thermal resistance from the die to the fluid by eliminating the additional layer of TIM between the lid thermal interface and the cold plate. Additionally, the segmented inset lid may be installed using standard semiconductor assembly processes for applying a lid or ring to a substrate with an adhesive material, thereby precluding the need for matched sets or complicated spring-and-piston assemblies. Also, the ability to separately install a removable flow cover over the segmented inset lid provides various options for cooling, minimizes the hindrances to solder reflow by reducing package weight, and provides the ability to maintain the fluid flow passages in the case of fouling.

Other technical advantages will be readily apparent to one skilled in the art from the following figures, descriptions, and claims. Moreover, while specific advantages have been enumerated above, various embodiments may include all, some, or none of the enumerated advantages.

Example Embodiments

Semiconductor packages, such as MCMs, in various applications include a laminate base having a silicon die in the center and a plurality of adjacent die distributed throughout. The die is attached at high temperatures and then cooled to room temperature. In order to ensure proper performance of a MCM using flip-chip devices, the individual die must be properly cooled during operation, typically through conduction on the passive back side of the die (i.e., the side facing away from the substrate). The heat generated within the active transistors conducts through the thermally conductive passive semiconductor material into a thermal interface material (TIM) before diffusing into a heat-sink. A device-level TIM typically consists of a compliant matrix with thermally conductive filler particles used to fill microscale air pockets that form due to the imperfect surface finish of the die and heat-sink interface surface. The TIM generally has a thermal conductivity that is one to two orders of magnitude lower than the bulk material of the die itself. Thus, it is desirable to minimize the bond line thickness of the TIM to minimize thermal resistance and to meet reliability and performance requirements.

One of the problems with conventional MCM and SIP packaging is the lack of uniformity in TIM bond line thickness caused by, for example, varying heights and sizes of the device components, assembly tolerance, and warpage. Nonuniformity in the TIM may cause increased interfacial thermal resistance between the bare die and the heat sink assembly. Flip-chip packages are often assembled with a single stiffening ring or lid designed to constrain package warpage. However, they often require a separate heatsink to be applied, and the lid thermal interface is attached to the heatsink via another layer of TIM. The result is an increase in the overall thermal resistance between the IC device and the cooling fluid, which can be either air or liquid. Moreover, if these lids or rings are excessive in weight, they may hinder solder attachment at the next higher assembly. Thus, traditionally formed cold plates are often precluded from use as a stiffening member.

The present disclosure is directed to a semiconductor package having a segmented inset lid, that is, a stiffening lid that is divided into multiple segments, each of which maintains a minimal TIM bond line with its respective die to maximize reliability and performance and to overcome the described thermal and warpage challenges. Specifically, by providing an inset lid having multiple separate segments/components, each segment can be configured to contact die and/or IC devices of different sizes or heights, and the thickness of the TIM to be added between the lid and the die may be reduced, thereby reducing thermal resistance. The present disclosure further includes a removable flow cover which may be mounted to the assembly and may be operable to allow the flow of fluid over the segmented inset lid when a pressure gradient is applied. Because the flow cover is detachable, the weight of package during assembly may be minimized.

Figure 1:
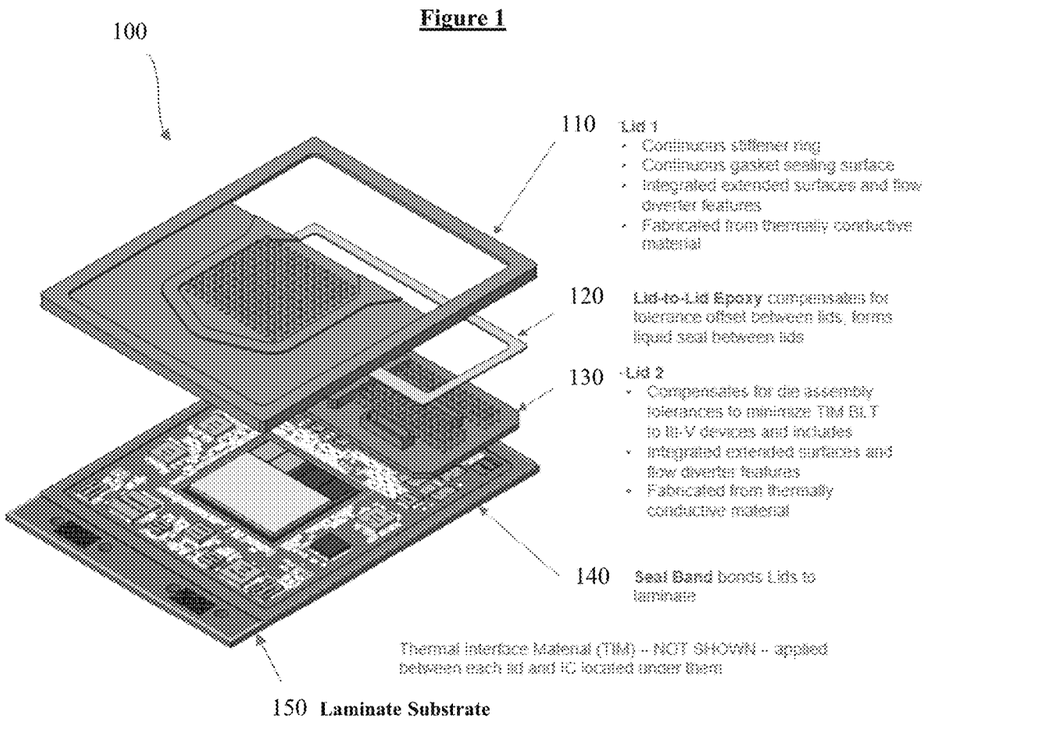
FIG. 1 illustrates an example semiconductor package having a segmented inset lid, in accordance with certain embodiments.

Reference is made to FIG. 1, wherein is shown a liquid flow-over semiconductor package segmented inset lid 100 (referred to hereafter as "segmented inset lid") for packaging one or more die mounted on a laminate substrate 150, in accordance with the present disclosure. The laminate substrate 150 may include a plurality of die mounted thereon, the plurality of die formed in varying sizes, heights, and tolerances. The segmented inset lid 100 may include a primary component 110 (referred to in FIG. 1 as "Lid 1") and a secondary component 130 (referred to in FIG. 1 as "Lid 2"), with a compliant adhesive 120 (referred to in FIG. 1 as a "Lid-to-Lid Epoxy") therebetween. Although FIG. 1 depicts a segmented inset lid 100 having one primary component and one secondary component, it is to be understood that the present disclosure may be adapted to include any number of primary components and any number of secondary components. For example, in an embodiment, the segmented inset lid may comprise a primary component and a plurality of secondary components. Moreover, it is to be understood that the primary and secondary components are operable to be formed in any shape, size, or manner, as understood by one of ordinary skill in the art.

The primary component 110 may be formed of a thermally conductive material and may attach to the laminate substrate 150 via an adhesive 140. Acting as both a ring and a lid, the primary component 110 may provide an overall stiffness that reduces package warpage. Specifically, the primary component 110 may comprise a continuous boundary surface which forms a uniform sealing surface that may make continuous or intermittent contact with a semiconductor package substrate. In an embodiment, the continuous boundary surface of the primary component 110 may comprise a minimum width of continuous material. In an embodiment, the continuous boundary surface of the primary component 110 may form a continuous stiffener ring. The continuous boundary surface of the primary component may provide a continuous sealing surface operable for the attachment of an optional flow cover 360 (described below) via, for example, an O-ring seal, a brazed joint seal, or other metal to metal bond, as applicable.

Additionally, the primary component 110 may comprise at least one continuous region formed of material, as well as at least one cutout region that is free of material. The at least one continuous region of the primary component 110 may comprise an upper surface (or a first surface) and a lower surface (or a second surface). The lower surface of the continuous region may comprise a heatsink interfacing surface operable for contacting one or more die mounted to the laminate substrate 150. The upper surface of the primary component 110 may include integrated extended surfaces (such as pins, fins, etc.) to promote heat transfer, as well as flow routing features to promote coolant distribution (i.e., when fluid is applied to the package). The integrated extended surfaces may be configured for heat sink and may comprise any design or combination of designs known or developed in the art; for example, the pins/fins may be rectangular, cylindrical, triangular, wavy, or any combination thereof. The upper surface of the continuous region may also be configured for gasket sealing, thereby allowing the potential for a variety of cold plate interfaces. The cutout region of the primary component 110 that is free from material may be operable to be mated and/or fitted with the secondary component 130, as shown in FIG. 1.

The secondary component 130 may also be formed of a thermally conductive material and may attach to the laminate substrate 150 via an adhesive 140. The shape of the secondary component 130 may be such that it may be coupled to the primary component 110 (i.e., by fitting within or over the primary component 110) and may provide an overall stiffness that reduces package warpage. The upper surface of the secondary component 130 may include protrusions or integrated extended surfaces (e.g., pins, fins, etc.) for heat transfer, as well as flow routing features for coolant distribution. Additionally, the secondary component 130 may separately contact one or more die that are mounted on the laminate substrate 150. In an embodiment, the secondary component 130 may be specific to die or IC devices that are inset therein. In an embodiment, the secondary component 130 may be operable to compensate for varying die assembly heights and tolerances to minimize the TIM. Together, the primary component and the secondary component(s) may reduce the impact of assembly tolerances and minimize the TIM bond line thickness over each die or IC device. Although FIG. 1 as described above shows one secondary component 130, it is to be understood that the segmented inset lid 100 may include a plurality of secondary components.

The segmented inset lid 100 may further include a compliant adhesive 120 configured for application between the primary component 110 and secondary component 130. The compliant adhesive 120 may compensate for any tolerance offset and may also form a liquid seal between the primary component 110 and the secondary component 130. In an embodiment, the primary component 110 and the secondary component 130 may include a lap-joint between which the compliant adhesive 120 may be applied, thereby forming a water-tight seal between the primary and secondary components. In an embodiment, the compliant adhesive 120 may comprise an epoxy or other similar resin.

Figure 2:
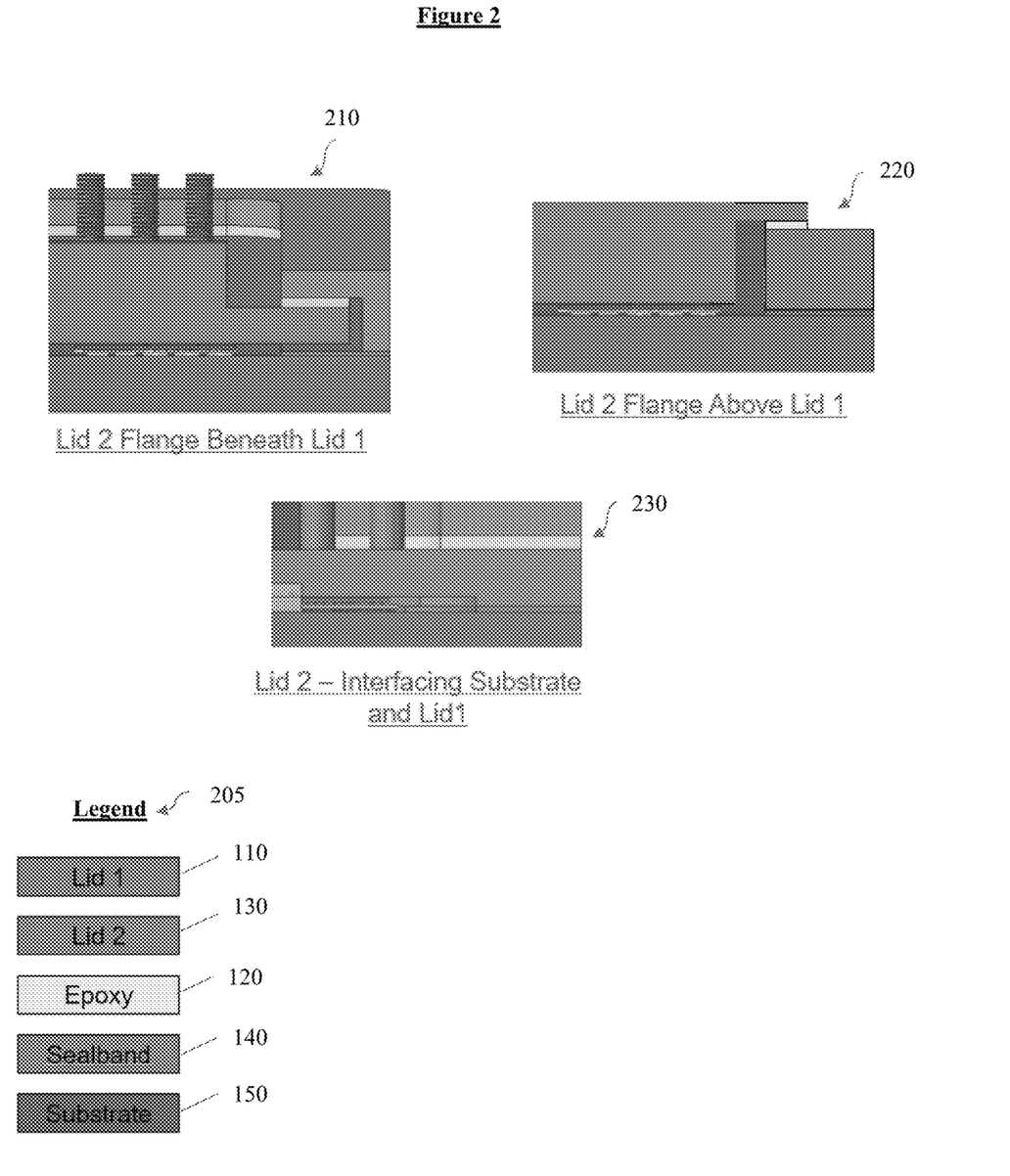
FIG. 2 illustrates examples of interfacing arrangements of a segmented inset lid of a semiconductor package, in accordance with certain embodiments.

While FIG. 1 illustrates one example of the how the primary and secondary components of the segmented inset lid 100 may be stacked, it is to be understood that the present disclosure is not to be limited to the depicted arrangement. The primary component 110, the secondary component 130, and the compliant adhesive 120 may be arranged and bonded to the laminate substrate 150 with adhesive 140 in a variety of ways. Reference is now made to FIG. 2, wherein is shown cross-sectional views of three example arrangements of the segmented inset lid, in accordance with the present disclosure. Legend 205 correlates each component of the package—including the segmented inset lid and the underlying substrate—with its corresponding color or shading. Example 210 shows the secondary component 130 fitted beneath the primary component 110 with the compliant adhesive 120 between them. Example 220 shows the secondary component 130 fitted over the primary component 110. Example 230 shows yet another arrangement in which the secondary component 130 interfaces between the primary component 110 and the laminate substrate 150. Additional arrangements of the components may be contemplated as within the scope of the present disclosure. Critically, the arrangement of the primary component 110, the secondary component 130 (or plurality of secondary components) and the compliant adhesive 120, forms a water-tight seal. The water-tight seals between the primary component 110 and the secondary component(s) 130 prevent fluid ingress through the interface between the components.

Figure 3A:
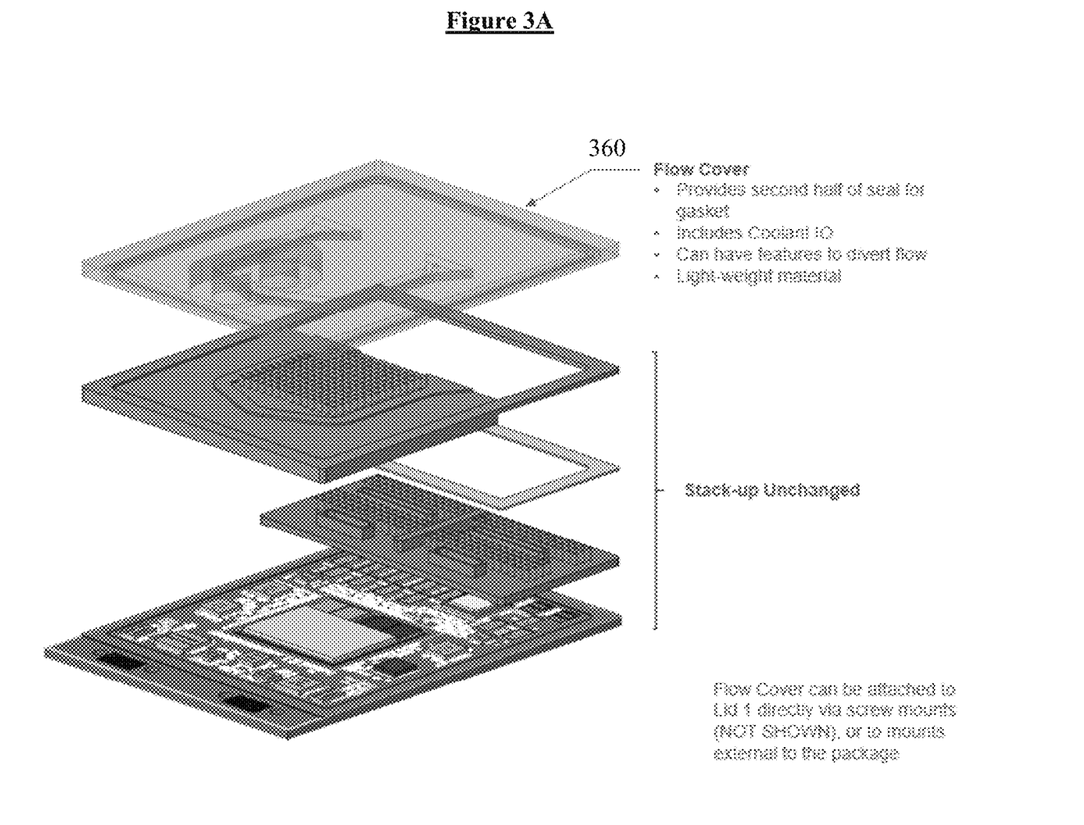
FIGS. 3A-3C illustrate example semiconductor packages having a segmented inset lid and flow cover, in accordance with certain embodiments.
Figure 3B:
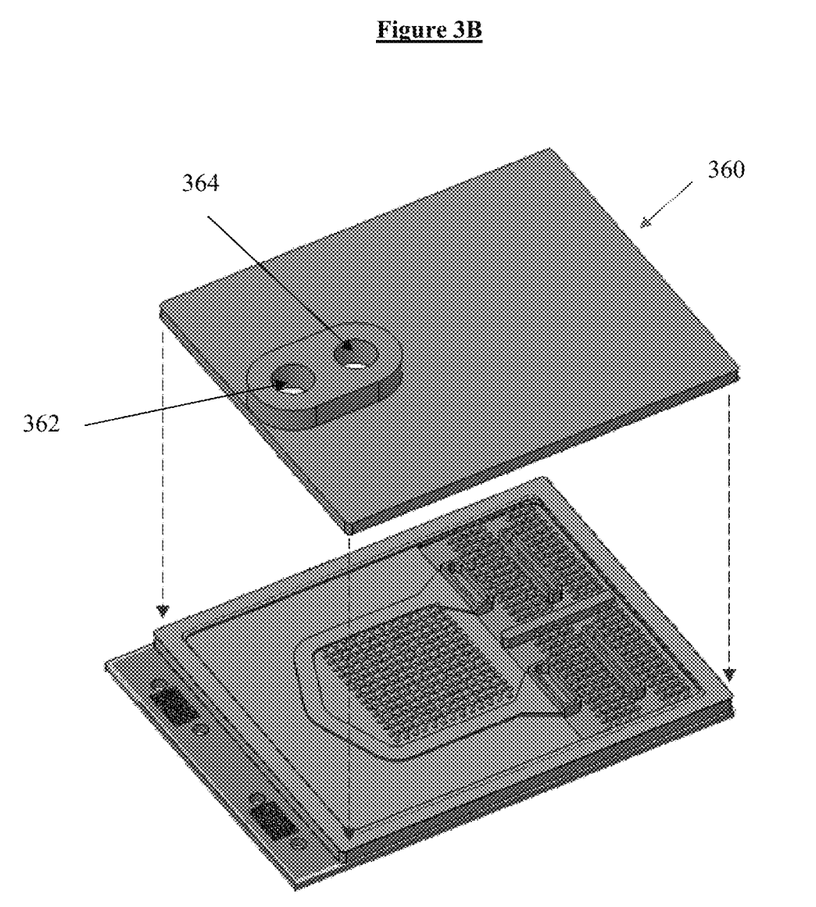
Figure 3C:
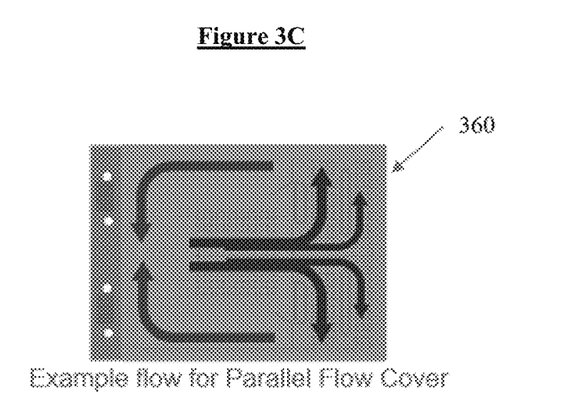

Reference is now made to FIGS. 3A, 3B, and 3C, wherein as are shown various views of an optional flow cover 360 which may be coupled or mounted to the segmented inset lid 100 of the semiconductor package. The flow cover 360 is optional in that its use may be based on specific applications. In an embodiment, the flow cover 360 may be used in applications requiring a liquid seal and/or having components to be protected from exposure to liquid coolant. The flow cover 360 may be removeable and may be attached directly to the primary component 110 via screw mounts (not shown) or mounts external to the package. The flow cover 360 may be used to introduce coolant to the semiconductor package and may include at least one fluid inlet 362 and at least one fluid outlet 364 to facilitate fluid flow over the primary component 110 and/or the secondary component 130 when a pressure gradient is applied. As shown in FIG. 3C, the flow cover 360 may also include features to direct or divert fluid flow. Additionally, the flow cover 360 is operable to form a seal with the continuous boundary surface of the primary component 110. Also, since weight is an important consideration for semiconductor packaging, in an embodiment, the flow cover 360 may comprise a light-weight material, e.g., plastic, etc. In an embodiment, the flow cover 360 may be installed after the segmented inset lid 100 is mounted to the substrate. As a result, less weight is applied on solder interconnects during mounting.

Figure 4:
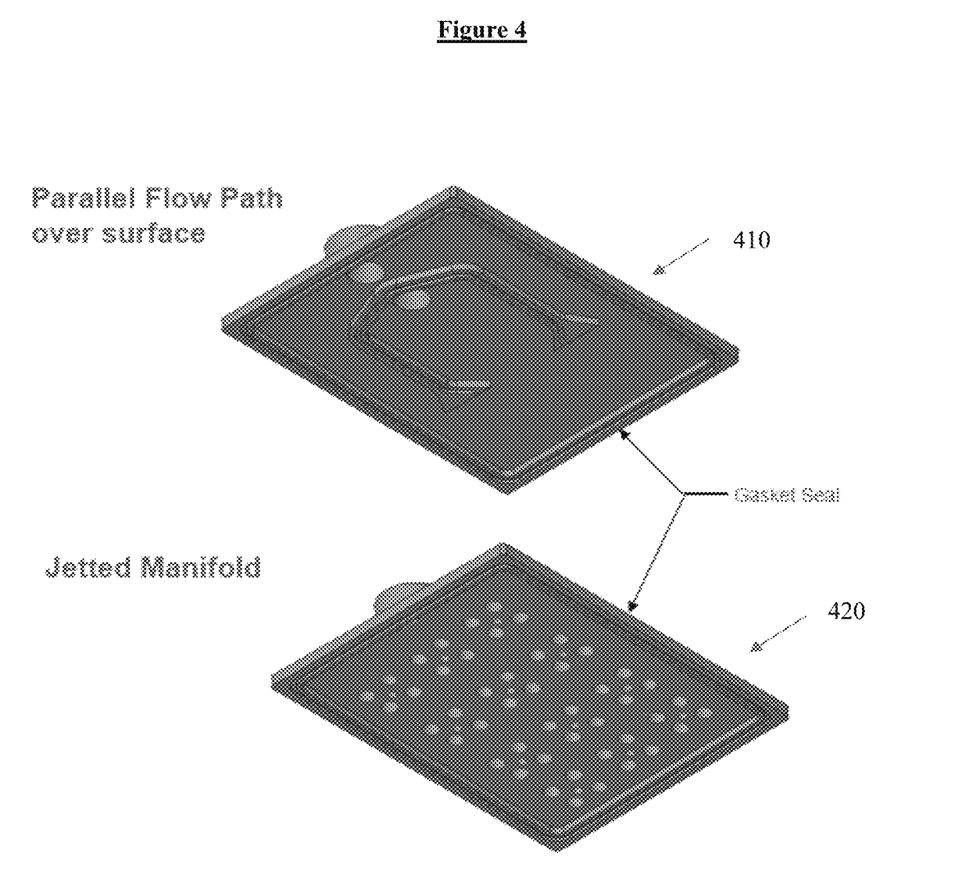
FIG. 4 illustrates example undersides of semiconductor package flow covers, in accordance with certain embodiments.

The design of the flow cover 360 of the present disclosure may be adapted based on particular applications. Reference is now made to FIG. 4, wherein is shown two example embodiments (first embodiment 410 and second embodiment 420) of the underside of the flow cover 360. In the first embodiment 410, the flow cover 360 may include one fluid inlet 362 and one fluid outlet 364 comprising adjacent cylinders, which provide a means for fluid to flow over the components of the segmented inset lid. In the second embodiment 420, the flow cover 360 may comprise a jet manifold having a multiple orifice plate, which provides a means for fluid to impinge against the components of the segmented inset lid. A plurality of openings may be distributed throughout the flow cover, with the smaller openings of the second embodiment 420 comprising inlets and the larger openings comprising outlets.

In accordance with the foregoing, the present disclosure also contemplates one or more methods for assembling a semiconductor package. In an embodiment, the steps of a method for assembling a semiconductor package may be in accord with the disclosure set forth in conjunction with the semiconductor package depicted in FIGS. 1, 2, 3A-3C, and 4. As such, similar and corresponding terms described in conjunction with FIGS. 1, 2, 3A-3C, and 4 may have the same meaning when used in conjunction with the method. Additionally, the present disclosure incorporates by reference the description of FIGS. 1, 2, 3A-3C, and 4 for the purposes of explaining, expounding upon, or otherwise clarifying the steps of the method.

In an embodiment, the method for assembling a semiconductor package may include the step of mounting a segmented inset lid to a substrate, the segmented inset lid comprising a primary component, one or more secondary components, and a compliant adhesive between the primary component and each of the one or more secondary components. The primary component may comprise a continuous boundary surface which forms a uniform sealing surface that may make continuous or intermittent contact with a semiconductor package substrate. In an embodiment, the continuous boundary surface of the primary component may comprise a minimum width of continuous material. In another embodiment, the continuous boundary surface of the primary component may form a stiffener ring.

The primary component may further comprise at least one continuous region having an upper surface and a lower surface. The upper surface of the at least one continuous region may include integrated extended surfaces to promote heat transfer and one or more routing features to promote coolant distribution. The lower surface of the at least one continuous region may contact one or more die that are mounted to an underlying substrate. The one or more secondary components may be fitted to the primary component and may contact one or more die that are mounted on an underlying substrate. The one or more secondary components may also include integrated extended surfaces to promote heat transfer and one or more routing features to promote coolant distribution. The method may further include the step of coupling a removeable flow cover to the segmented inset lid. The flow cover may be used to introduce coolant to the semiconductor package and may include at least one fluid inlet and at least one fluid outlet to facilitate fluid flow over the primary and secondary components when a pressure gradient is applied. The flow cover may form a seal with the continuous boundary surface of the primary component. The described method may be modified and/or include additional steps in accordance with the features of the semiconductor package described in the present disclosure and/or illustrated in FIGS. 1, 2, 3A-3C, and 4.

It is to be understood that the semiconductor package and the method of assembling the semiconductor package of the present disclosure may be adapted and/or modified without departing from the scope of the present disclosure. The referenced figures are provided for purposes of illustration, and it is to be understood that the present disclosure is not limited to the particular designs and implementations that are illustrated.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference to an apparatus, system, or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

The embodiments disclosed herein are only examples, and the scope of this disclosure is not limited to them. Particular embodiments may include all, some, or none of the components, elements, features, functions, operations, or steps of the embodiments disclosed herein. Embodiments according to the disclosure are in particular directed to a semiconductor package and a method for assembling a semiconductor package, wherein any feature mentioned in one category—for example, the package—may be applicable in another category, like the method, as well. The various features disclosed herein may be combined or separated in any suitable manner.

The invention claimed is:

1. A semiconductor package comprising:
   a segmented inset lid that is divided into a primary component and one or more secondary components, with each secondary component being coupled to the primary component by a compliant liquid-tight adhesive;
   wherein the primary component is a continuous region including i) a first surface, ii) a second surface, iii) a boundary surface, and (iv) a cutout region, the first surface including one or more integrated heat sink surfaces or one or more routing features to promote coolant distribution, the second surface contacting one or more semiconductor dies, the boundary surface forming a sealing surface with a semiconductor substrate; and the cutout region being free of material,
   wherein each secondary component contacts at least one other semiconductor die and forms a water-tight seal with the primary component, and
   a removable flow cover coupled with the segmented inset lid to form a seal along the boundary surface.

2. The semiconductor package of claim 1, wherein each secondary component includes additional integrated heat sink surfaces or one or more additional routing features to promote coolant distribution.

3. The semiconductor package of claim 1, wherein the primary component and each of the secondary components are individually configured to a height of a different semiconductor die or integrated circuit device.

4. The semiconductor package of claim 3, wherein the primary component and each of the secondary components maintain a thermal interface material with substantially uniform thickness to its respective semiconductor dies or integrated circuit devices.

5. The semiconductor package of claim 1, wherein the primary component and each of the secondary components are formed of a thermally conductive material.

6. The semiconductor package of claim 1, wherein the primary component and each of the secondary components are attached to the substrate via an adhesive.

7. The semiconductor package of claim 1, wherein the boundary surface makes continuous contact with the semiconductor substrate, the boundary surface forming a stiffener ring.

8. The semiconductor package of claim 1, wherein the boundary surface makes intermittent contact with the semiconductor substrate, the boundary surface forming a stiffener ring.

9. The semiconductor package of claim 1, wherein the removable flow cover contains one or more fluid inlets, one or more fluid outlets, and additional features to facilitate fluid flow over the primary and secondary components.

10. The semiconductor package of claim 1, wherein the one or more integrated heat sink surfaces comprise one or more extended surfaces, the one or more extended surfaces comprising pins or fins.

11. The semiconductor package of claim 1, wherein a secondary component of the one or more secondary components fits at least partially within the cutout region of the primary component.

12. A method for assembling a semiconductor package comprising:
   providing a segmented inset lid, wherein the segmented inset lid is divided into a primary component and one or more secondary components, with each secondary component being coupled to the primary component by a compliant liquid-tight adhesive, wherein:
      the primary component is a continuous region including i) a first surface, ii) a second surface, iii) a boundary surface, and (iv) a cutout region, the first surface including one or more integrated heat sink surfaces or one or more routing features to promote coolant distribution, the second surface contacting one or more semiconductor dies, the boundary surface forming a sealing surface with a semiconductor substrate; and the cutout region being free of material, and
      each secondary component contacts at least one other semiconductor die and forms a water-tight seal with the primary component, and
   providing a removable flow cover, wherein the coupling a removable flow cover is coupled with the segmented inset lid to form a seal along the boundary surface of the primary component.

13. The method of claim 12, wherein each secondary component includes additional integrated heat sink surfaces or one or more additional routing features to promote coolant distribution.

14. The method of claim 12, wherein the primary component and each of the secondary components are individually configured to a height of a different semiconductor die or integrated circuit device.

15. The method of claim 14, wherein the primary component and each of the secondary components maintain a thermal interface material with substantially uniform thickness to its respective semiconductor dies or integrated circuit devices.

16. The method of claim 12, wherein the primary component and each of the secondary components are formed of a thermally conductive material.

17. The method of claim 12, wherein the primary component and each of the secondary components are attached to the substrate via an adhesive.

18. The method of claim 12, wherein the boundary surface makes continuous contact with the semiconductor substrate, the boundary surface forming a stiffener ring.

19. The method of claim 12, wherein the boundary surface makes intermittent contact with the semiconductor substrate, the boundary surface forming a stiffener ring.

20. The method of claim 12, wherein the removable flow cover contains one or more fluid inlets, one or more fluid outlets, and additional features to facilitate fluid flow over the primary and secondary components.

* * * * *